US008278996B2

(12) United States Patent
Miki et al.

(10) Patent No.: US 8,278,996 B2
(45) Date of Patent: Oct. 2, 2012

(54) REFERENCE CURRENT GENERATING CIRCUIT

(75) Inventors: Kazuhiko Miki, Kanagawa-ken (JP); Toru Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/716,831

(22) Filed: Mar. 3, 2010

(65) Prior Publication Data

US 2011/0050330 A1    Mar. 3, 2011

(30) Foreign Application Priority Data

Sep. 2, 2009    (JP) .................................. 2009-202816

(51) Int. Cl.
    G05F 1/10    (2006.01)
(52) U.S. Cl. ........................ 327/541; 327/103
(58) Field of Classification Search .................. 327/540, 327/541, 103
    See application file for complete search history.

(56) References Cited

U.S. PATENT DOCUMENTS

| | | | | |
|---|---|---|---|---|
| 5,218,364 A * | 6/1993 | Kumazawa et al. | ........... | 341/136 |
| 5,231,316 A * | 7/1993 | Thelen, Jr. | ........... | 327/103 |
| 5,291,123 A * | 3/1994 | Brown | ........... | 323/369 |
| 5,739,681 A * | 4/1998 | Allman | ........... | 323/314 |
| 6,087,820 A | 7/2000 | Houghton | | |
| 6,373,266 B1 * | 4/2002 | Carelli et al. | ........... | 324/716 |
| 6,677,809 B2 * | 1/2004 | Perque et al. | ........... | 327/541 |
| 6,744,305 B2 * | 6/2004 | Oikawa et al. | ........... | 327/541 |
| 6,922,098 B2 * | 7/2005 | Choi et al. | ........... | 327/538 |
| 6,922,182 B2 * | 7/2005 | Sase | ........... | 345/76 |
| 6,956,413 B2 * | 10/2005 | Bailey | ........... | 327/131 |
| 7,002,402 B2 | 2/2006 | Boxho | | |
| 7,106,032 B2 * | 9/2006 | Chen et al. | ........... | 323/269 |
| 7,173,549 B2 * | 2/2007 | Nakano et al. | ........... | 341/139 |
| 7,218,168 B1 * | 5/2007 | Rahman | ........... | 327/540 |
| 7,233,190 B2 * | 6/2007 | Tanzawa | ........... | 327/355 |
| 7,385,377 B2 * | 6/2008 | Pisasale et al. | ........... | 323/267 |
| 7,417,494 B2 * | 8/2008 | Choi et al. | ........... | 327/541 |
| 7,440,332 B2 * | 10/2008 | Gallo et al. | ........... | 365/185.22 |
| 7,508,252 B2 * | 3/2009 | Yamazaki et al. | ........... | 327/536 |
| 7,573,323 B2 * | 8/2009 | Moholt et al. | ........... | 327/538 |
| 7,633,335 B2 * | 12/2009 | Fujikura et al. | ........... | 327/540 |
| 7,656,225 B2 * | 2/2010 | Isobe et al. | ........... | 327/540 |

(Continued)

FOREIGN PATENT DOCUMENTS

JP         09-106316        4/1997

(Continued)

OTHER PUBLICATIONS

Japanese Office Action for Application No. 2009-202816 dated Aug. 30, 2011.

Primary Examiner — Thomas J Hiltunen
(74) Attorney, Agent, or Firm — Turocy & Watson, LLP (57) ABSTRACT

A reference current generating circuit includes an operational amplifier having one input terminal to receive a reference voltage and a field effect transistor having a gate to receive an output voltage of the operational amplifier. k resistors (k is an integer not less than 2) are connected in series to a drain of the field effect transistor, and a voltage at one of connection points of the resistors is feed backed to the other input terminal of the operational amplifier. A switch selects one of the connection points of the resistors and applies the voltage of the selected connection point as a reference voltage to a gate of a reference transistor to generate a reference current.

9 Claims, 9 Drawing Sheets

U.S. PATENT DOCUMENTS

| | | | |
|---|---|---|---|
| 7,724,600 B1* | 5/2010 | Im et al. | 365/225.7 |
| 7,795,953 B2* | 9/2010 | Ogiwara et al. | 327/541 |
| 7,880,531 B2* | 2/2011 | Park | 327/538 |
| 7,907,002 B2* | 3/2011 | Bracmard et al. | 327/540 |
| 2001/0017567 A1* | 8/2001 | Kawakubo | 327/540 |
| 2004/0041595 A1* | 3/2004 | Ogawa et al. | 327/94 |
| 2004/0051582 A1* | 3/2004 | Fan et al. | 327/540 |
| 2006/0103451 A1* | 5/2006 | Lim et al. | 327/540 |
| 2006/0103453 A1* | 5/2006 | Pisasale et al. | 327/541 |
| 2006/0202738 A1* | 9/2006 | Gatta et al. | 327/427 |
| 2008/0218221 A1* | 9/2008 | Yen et al. | 327/103 |
| 2009/0080267 A1* | 3/2009 | Bedeschi et al. | 365/189.09 |
| 2009/0322297 A1* | 12/2009 | Shiota | 323/282 |
| 2010/0237933 A1* | 9/2010 | Hioka et al. | 327/543 |
| 2011/0050196 A1* | 3/2011 | Fuse et al. | 323/312 |

FOREIGN PATENT DOCUMENTS

| | | |
|---|---|---|
| JP | 2005-302197 | 10/2005 |
| JP | 2009-037372 | 2/2009 |

* cited by examiner

REFERENCE CURRENT GENERATING CIRCUIT

CROSS-REFERENCE TO RELATED APPLICATION

This application is based upon and claims the benefit of priority from prior Japanese Patent Application No. 2009-202816, filed Sep. 2, 2009, the entire contents of which are incorporated herein by reference.

BACKGROUND OF THE INVENTION

1. Field of the Invention

The invention relates to a reference current generating circuit, and particularly to a reference current generating circuit capable of compensating a deviation of a reference current from a preset value before shipment in advance.

2. Description of the Background Art

A sense circuit for a flash memory determines read data to be "1" when a cell current is larger than a reference current, and determines the read data to be "0" when a cell current is smaller than a reference current. Here, a memory cell is called "on-cell" if "1" is stored in the memory cell, and is called "off-cell" if "0" is stored in the memory cell.

A memory cell array in which such memory cells are arranged in a matrix has on-cell and off-cell currents which are distributed within certain ranges due to variation in characteristic of each memory cell. Consequently, the value of the reference current to be compared with the memory cell current is desirably set in an intermediate area between the lower limit of the on-cell current distribution and the upper limit of the off-cell current distribution.

Japanese Patent Application Publication No. 2005-302197, for example, discloses a method of reducing the effects of manufacturing process variation without adversely affecting reading speed in the following manner. A reference signal is supplied from a sense amplifier reference circuit to multiple sense amplifiers, and the gate sizes of respective P-channel MOS transistors formed in the sense amplifiers and the sense amplifier reference circuit are suitably designed.

However, a conventional reference current generating circuit has a problem in that a read operation margin is reduced because the reference current varies due to manufacturing process variation, operating temperature, and a power supply voltage. It is thus difficult to design a circuit which allows such variation.

BRIEF SUMMARY OF THE INVENTION

According to one aspect of the invention, there is provided a reference current generating circuit including: an operational amplifier having one input terminal to receive a reference voltage; a field effect transistor having a gate to receive an output voltage of the operational amplifier and a drain; k resistors (k is an integer not less than 2) connected in series to the drain of the field effect transistor and feed backing a voltage at one of connection points of the resistors to the other input terminal of the operational amplifier; a switch to provide a voltage at one of the connection points of the resistors as a standard voltage; and a reference transistor having a gate, to generate a reference current when the standard voltage is applied to the gate.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A reference current generating circuit according to an exemplary embodiment of the present invention will now be described with reference to the accompanying drawings wherein the same or like reference numerals designate the same or corresponding parts throughout the several views.

First Embodiment

Figure 1:
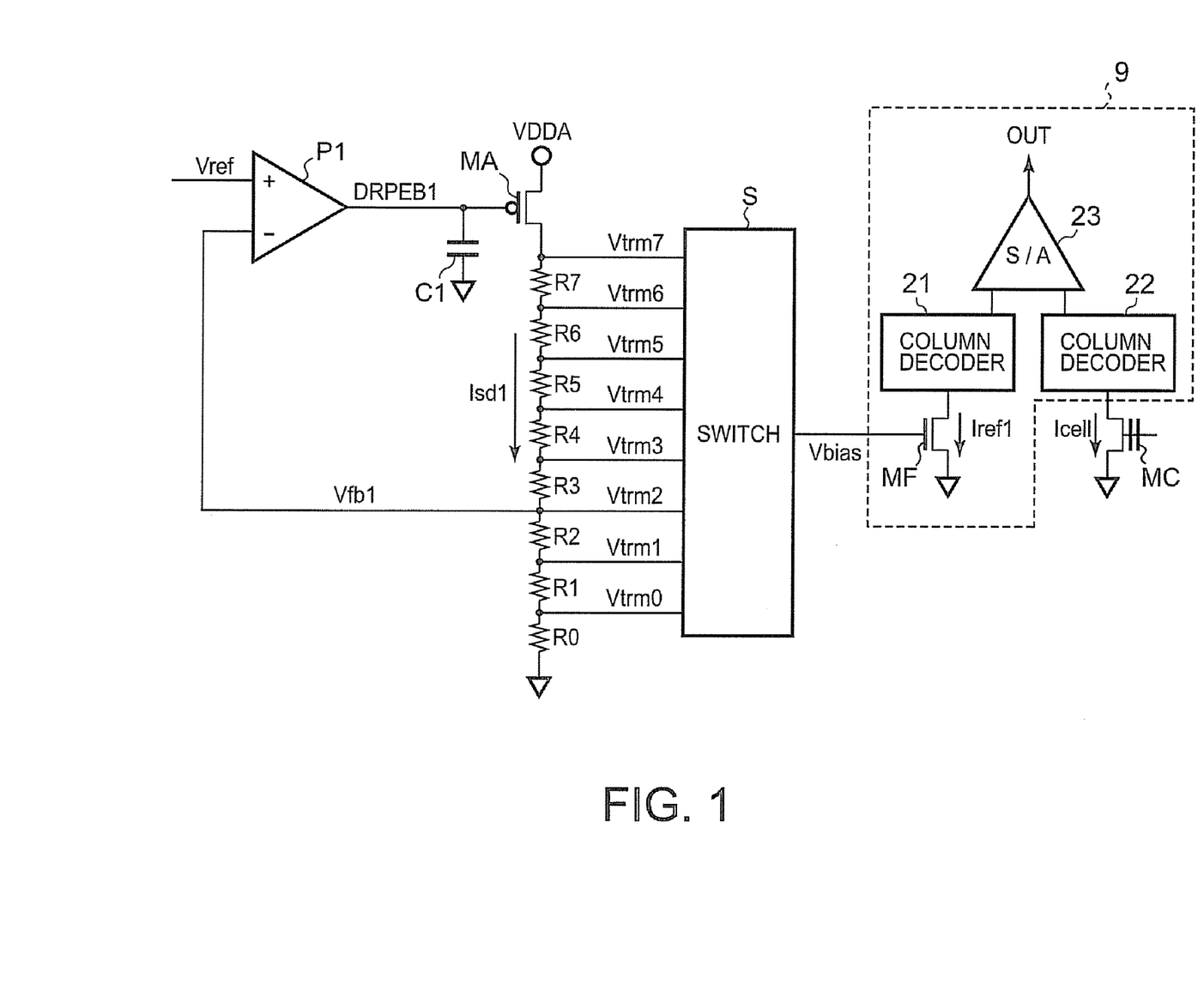
FIG. 1 is a block diagram schematically showing a structure of a reference current generating circuit according to a first embodiment of the invention.

FIG. 1 is a block diagram schematically showing a structure of a reference current generating circuit according to a first embodiment of the invention. In FIG. 1, the reference current generating circuit includes an operational amplifier P1, a P-channel field effect transistor MA, a capacitor C1, resistors R0 to R7, and a switch S. A sense circuit 9 includes a reference transistor MF, column decoders 21, 22, and a sense amplifier 23.

The resistors R0 to R7 are connected in series with each other, and one terminal of each of the resistors R0 to R7 is connected to the input of the switch S while the output of the switch S is connected to the gate of the reference transistor MF. The switch S selects one of the terminals of the resistors R0 to R7, and connects the selected terminal to the gate of the reference transistor MF. One terminal of the resistors R0 to R7 is connected to a negative input terminal of the operational amplifier P1.

The output terminal of the operational amplifier P1 is connected to the capacitor C1 as well as to the gate of the P-channel field effect transistor MA. The source of the P-channel field effect transistor MA is connected to power supply potential VDDA, and the drain of the P-channel field effect transistor MA is connected to the series circuit of the resistors R0 to R7.

The drain of the reference transistor MF is inputted to one input terminal of the sense amplifier 23 via the column decoder 21, while the drain of a memory cell MC is inputted to another input terminal of the sense amplifier 23 via the column decoder 22. A flash memory, a ferroelectric memory, or an EEPROM may be used as the memory cell MC.

An output voltage DRPEB1 is generated in the operational amplifier P1 in accordance to the difference between a feedback voltage Vfb1 and a reference voltage Vref, and is applied to the gate of the P-channel field effect transistor MA. A band-gap reference voltage, for example, may be used as the reference voltage Vref since the band-gap reference voltage has less aged deterioration over its product life as well as less source voltage dependency and temperature dependency. Then the drain current generated in the P-channel field effect transistor MA flows in the series circuit of the resistors R0 to R7 to generate a standard current Isd1.

The divided voltage Vfb1 divided by the resistors R0 to R7 upon generation of the standard current Isd1 is inputted to the negative input terminal of the operational amplifier P1 and is compared with the reference voltage Vref, which has been inputted to a positive input terminal of the operational amplifier P1.

When the standard current Isd1 flows through the series circuit of the resistors R0 to R7, divided voltages Vtrm0 to Vtrm7 will be generated at respective terminals of the resistors R0 to R7. After one of the terminals of the resistors R0 to R7 is selected by the switch S, corresponding one of the divided voltages Vtrm0 to Vtrm7 is applied to the gate of the reference transistor MF as a standard voltage Vbias.

When the standard voltage Vbias is applied to the gate of the reference transistor MF, a reference current Iref flows through the reference transistor MF and is inputted to one input terminal of the sense amplifier 23 via the column decoder 21.

On the other hand, a cell current Icell read from the memory cell MC is inputted to another input terminal of the sense amplifier 23 via the column decoder 22. Now, the cell current Icell is compared with the reference current Iref1 in the sense amplifier 23. When the cell current Icell is greater than the reference current Iref1, the read data is determined to be "1", and when the cell current Icell is smaller than the reference current Iref1, the read data is determined to be "0."

It is possible to select one of the respective terminals of the resistors R0 to R7 by the switch S so that the reference current Iref1 is set to fall within the intermediate area between the lower limit of the on-cell current distribution and the upper limit of the off-cell current distribution.

Thus, even if the characteristic of the P-channel field effect transistor MA is varied due to manufacturing process variation, operating temperature, or a power supply voltage, and the standard current Isd1 is changed accordingly, it becomes possible to counteract the variation in the standard voltage Vbias, thereby reducing variation in the reference current Iref1. Accordingly, even if the characteristic of the P-channel field effect transistor MA is varied, an error in reading the memory cell MC can be reduced by adjusting the value of the reference current Iref1 within the intermediate area between the lower limit of the on-cell current distribution and the upper limit of the off-cell current distribution.

Second Embodiment

Figure 2:
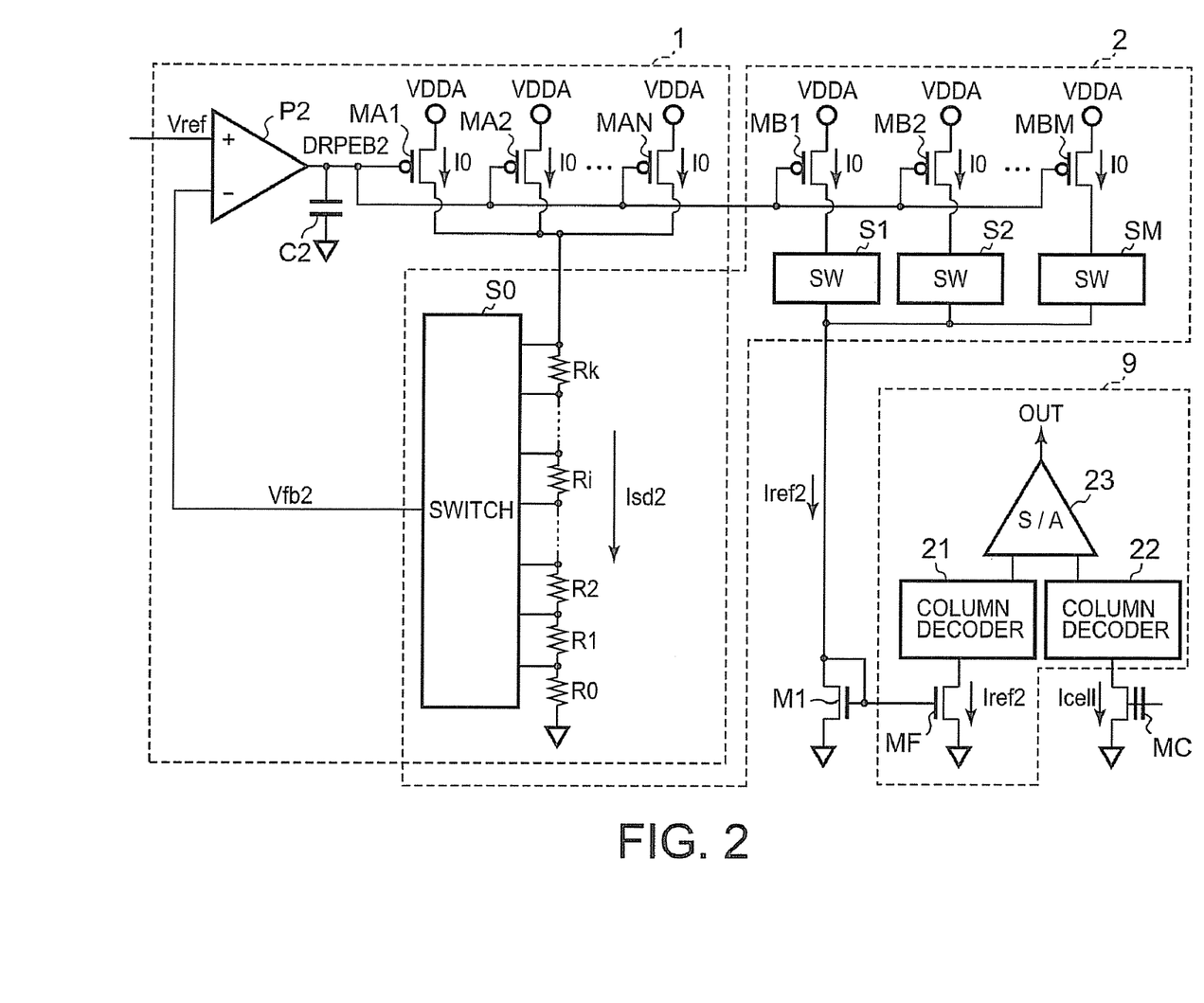
FIG. 2 is a block diagram schematically showing a structure of a reference current generating circuit according to a second embodiment of the invention.

FIG. 2 is a block diagram schematically showing a structure of a reference current generating circuit according to a second embodiment of the invention. In FIG. 2, the reference current generating circuit includes a standard current generating circuit 1 and a trimming circuit 2. The standard current generating circuit 1 includes an operational amplifier P2, and N (N is a positive integer) P-channel field effect transistors MA1 to MAN, and a capacitor C2. The trimming circuit 2 includes k (k is an integer not less than 2) resistors R0 to Rk, a switch S0, M (M is an integer not less than 2) P-channel field effect transistors MB1 to MBM, and M switches S1 to SM. It is preferable to match the characteristic of the P-channel field effect transistors MA1 to MAN to that of the P-channel field effect transistors MB1 to MBM by designing the size and shape of the P-channel field effect transistors MA1 to MAN to be the same as those of the P-channel field effect transistors MB1 to MBM, and arranging both transistors closely to each other on a same semiconductor chip.

The resistors R0 to Rk are connected in series to each other, and the terminals of the resistors R0 to Rk are connected to the input of the switch S0. The output of the switch S0 is connected to a negative input terminal of the operational amplifier P2. The switch S0 selects one of the terminals of the resistors R0 to Rk, and connects the selected terminal to the negative input terminal of the operational amplifier P2. The output terminal of the operational amplifier P2 is connected to the capacitor C2 as well as to the gates of the P-channel field effect transistors MA1 to MAN and MB1 to MBM.

The sources of the P-channel field effect transistors MA1 to MAN and MB1 to MBM are connected to a power supply potential VDDA, and the drains of the P-channel field effect transistors MA1 to MAN are connected to the series circuit of the resistors R0 to Rk. The drains of the P-channel field effect transistors MB1 to MBM are connected to the drain of an N-channel field effect transistor M1 via the switches S1 to SM, respectively. The switches S1 to SM select at least one of the P-channel field effect transistors MB1 to MBM, and merge currents I0 flowing through the selected P-channel field effect transistors to generate a reference current Iref2. The drain of the N-channel field effect transistor M1 is connected to the gate of the N-channel field effect transistor M1 and the gate of a reference transistor MF.

A standard current Isd2 generated in the standard current generating circuit 1 flows through the resistors R0 to Rk. A divided voltage Vfb2 divided by the resistors R0 to Rk is inputted to the negative input terminal of the operational amplifier P2 via the switch S0 and is compared with a reference voltage Vref, which has been inputted to the positive input terminal of the operational amplifier P2. Assuming that a voltage is taken from the lower terminal of the resistor Ri by the switch S0, the divided voltage Vfb2 can be given by Isd2×(R0+R1+ . . . +Ri).

In the operational amplifier P2, an output voltage DRPEB2 is generated so that the difference between the divided voltage Vfb2 and the reference voltage Vref becomes 0. The output voltage DRPEB2 is applied to the gates of the P-channel field effect transistors MA1 to MAN and MB1 to MBM. When the P-channel field effect transistors MA1 to MAN and MB1 to MBM have the same characteristic, drain currents I0 with the same value are generated in the P-channel field effect transistors MA1 to MAN and MB1 to MBM by applying the same output voltage DRPEB2 to the P-channel field effect transistors MA1 to MAN and MB1 to MBM.

Then respective drain currents I0 generated in the P-channel field effect transistors MA1 to MAN flow in the series circuit of the resistors R0 to Rk to generate the standard current Isd2. The standard current Isd2 can be given by N×I0.

The drain currents I0 generated in the respective P-channel field effect transistors MB1 to MBM are merged together via the switches S1 to SM, respectively, to generate a reference current Iref2, which is supplied to the N-channel field effect transistor M1.

When the reference current Iref2 is supplied to the N-channel field effect transistor M1, current mirror operation between the N-channel field effect transistor M1 and the reference transistor MF causes the reference current Iref2 to flow through the reference transistor MF, and the reference current Iref2 is inputted to one input terminal of a sense amplifier 23 via a column decoder 21.

A cell current Icell read from a memory cell MC is inputted to the other input terminal of the sense amplifier 23 via a column decoder 22. The cell current Icell is compared with the reference current Iref2 in the sense amplifier 23. When the cell current Icell is greater than the reference current Iref2, read data is determined to be "1", and when the cell current Icell is smaller than the reference current Iref2, the read data is determined to be "0."

One of the terminals of the resistors R0 to Rk is selected by the switch S0 so that the reference current Iref2 should be set to fall within the intermediate area between the lower limit of the on-cell current distribution and the upper limit of the off-cell current distribution. At the same time, at least one of the P-channel field effect transistors MB1 to MBM is selected by the switches S1 to SM to merge the currents I0 flowing through the selected P-channel field effect transistors.

Thus, even if the characteristic of the P-channel field effect transistor MA1 to MAN is varied due to manufacturing process variation, operating temperature, or a power supply voltage, it becomes possible to counteract the variation in the standard current Iref2. In addition, since the reference current Iref2 is generated as a current mirror of the standard current Isd2 generated in the reference current generating circuit 1, the variation in the reference current Iref2 flowing through the reference transistor MF can be prevented even if the characteristic of the reference transistor MF is varied due to environmental temperature change.

Assuming that m switches out of M switches S1 to SM are turned on, the reference current Iref2 can be given by m×I0=m/N×Isd2=m/N×Vref/(R0+R1+ . . . +Ri).

Here, a median value of the reference current Iref2 is adjusted by using the term, Vref/(R0+R1+ . . . +Ri). Specifically, a trimming unit of the reference current Iref2 can be determined by the number N of the P-channel field effect transistors MA1 to MAN. In other words, the trimming value of the reference current Iref2 can be set with m, which is the number of the switches S1 to SM that are turned on. In this case, the range of the trimming value is from I0 to I0×M, thus the maximum trimming value can be determined by M, which is the number of the P-channel field effect transistors MB1 to MBM.

Now variation in (R0+R1+ . . . +Ri) due to device variation is compensated by adjusting m, which is the number of switches S1 to SM that are turned on, before the shipment of the devices. Also a variation due to characteristic variations of transistors other than the (R0+R1+ . . . +Ri) is compensated by using negative feedback operation of the operational amplifier P2. This allows the reference current Iref2 to be set with high precision.

In the embodiment of FIG. 2, there is described a method in which provided are the resistors R0 to Rk and the switch S0 to adjust the standard current Isd2 as well as the P-channel field effect transistors MB1 to MBM and the switches S1 to SM to adjust the reference current Iref2. However, only the resistors R0 to Rk and the switch S0 to adjust the standard current Isd2 may be provided, or only the P-channel field effect transistors MB1 to MBM and the switches S1 to SM to adjust the reference current Iref2 may be provided.

Third Embodiment

Figure 3:
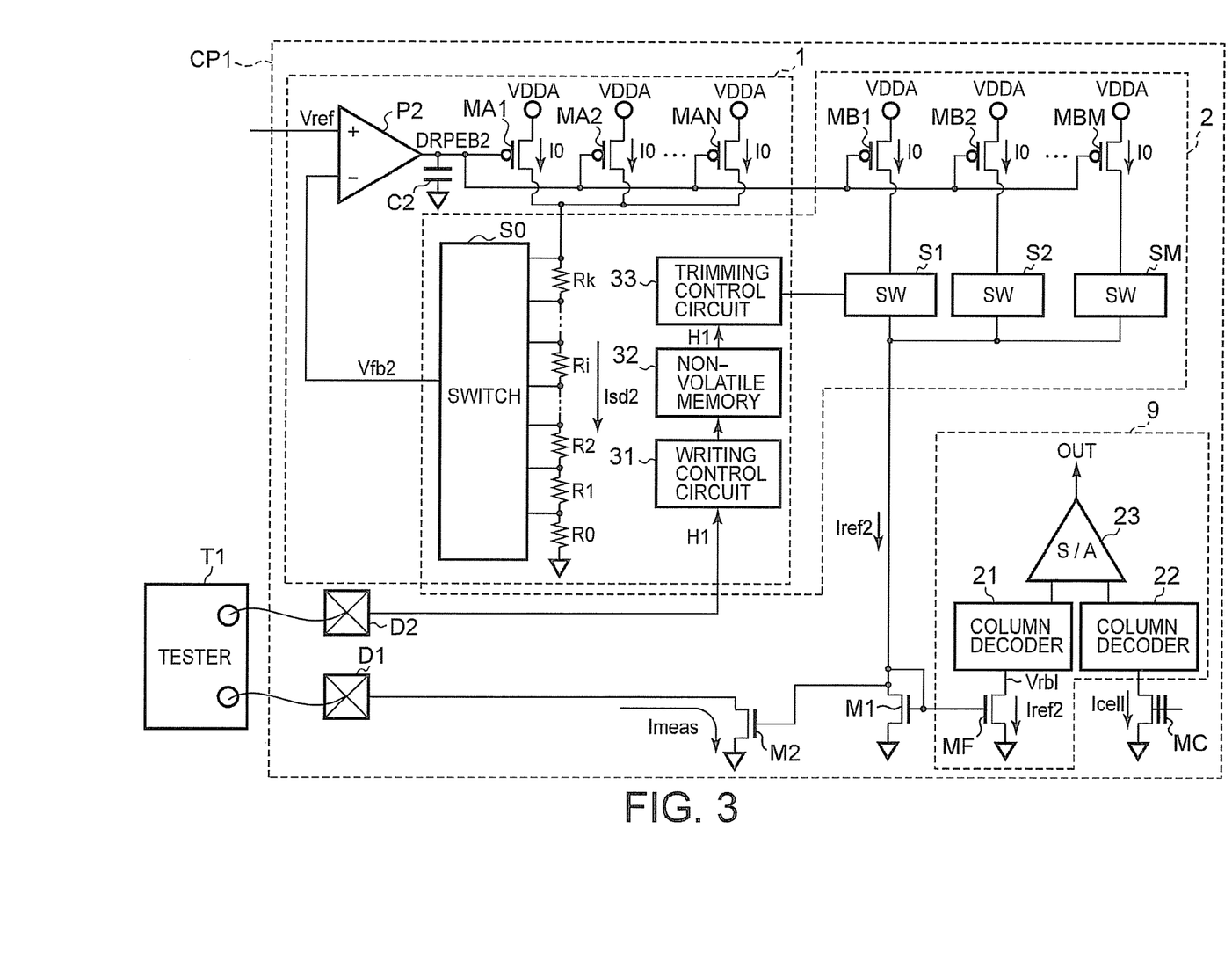
FIG. 3 is a block diagram schematically showing a structure of a reference current generating circuit according to a third embodiment of the invention.

FIG. 3 is a block diagram schematically showing a structure of a reference current generating circuit according to a third embodiment of the invention. In FIG. 3, the reference current generating circuit includes an N-channel field effect transistor M2, a writing control circuit 31, a nonvolatile memory 32, and a trimming control circuit 33, in addition to the configuration of the reference current generating circuit in FIG. 2.

The nonvolatile memory 32 stores a trimming value H1 indicating the number of the P-channel field effect transistors MB1 to MBM to be selected. The writing control circuit 31 controls writing to the nonvolatile memory 32, and the input of the writing control circuit 31 is connected to a pad electrode D2. The trimming control circuit 33 adjusts the number of the P-channel field effect transistors MB1 to MBM that are selected by switches S1 to SM on the basis of the trimming value H1 stored in the nonvolatile memory 32. The gate of the N-channel field effect transistor M2 is connected to the drain of an N-channel field effect transistor M1, and the drain of the N-channel field effect transistor M2 is connected to a pad electrode D1. Note that, the N-channel field effect transistors M1, M2 are configured to have the same size and shape with each other.

The standard current generating circuit 1, a trimming circuit 2, a sense circuit 9, the N-channel field effect transistors M1, M2, the writing control circuit 31, the nonvolatile memory 32, the trimming control circuit 33 and the pad electrodes D1, D2 are formed on a semiconductor chip CP1.

The trimming of a reference current Iref2 is done in the product inspection before the shipment in the following method. The pad electrode D1 is connected to a current measurement terminal of a tester T1, and the pad electrode D2 is connected to a trimming value output terminal of the tester T1. A drain voltage Vrb1 of a reference transistor MF is applied to the pad electrode D1 from the tester T1, and a current Imeas which flows through the N-channel field effect transistor M2 then is measured.

Here, a table to select the trimming value H1 according to the current Imeas is prepared in advance. The trimming value H1 is selected according to the current Imeas by referring to the table. The trimming value H1 is written in the nonvolatile memory 32 by inputting the trimming value H1 to the writing control circuit 31 via the pad electrode D2. The number of the P-channel field effect transistors MB1 to MBM from which a drain current I0 is taken is adjusted in trimming control circuit 33 by turning on or off the respective switches S1 to SM according to the trimming value H1 written in the nonvolatile memory 32. Thus, the reference current Iref2 is generated. When the reference current Iref2 is generated, the current Imeas having the same value as the reference current Iref2 flows through the N-channel field effect transistor M2 due to current mirror operation between the N-channel field effect transistors M1, M2. Accordingly, the reference current Iref2 can be monitored.

Then after the product shipment, when power is supplied to the product, the trimming value H1 stored in the nonvolatile memory 32 is read by the trimming control circuit 33, and the number of the P-channel field effect transistors MB1 to MBM from which the drain current I0 is taken is adjusted by turning on or off the respective switches S1 to SM according to the trimming value H1. Then, the drain current I0 flowing from the turned-on P-channel field effect transistors are merged. Thus, the reference current Iref2 is generated and supplied to the N-channel field effect transistor M1.

Fourth Embodiment

Figure 4:
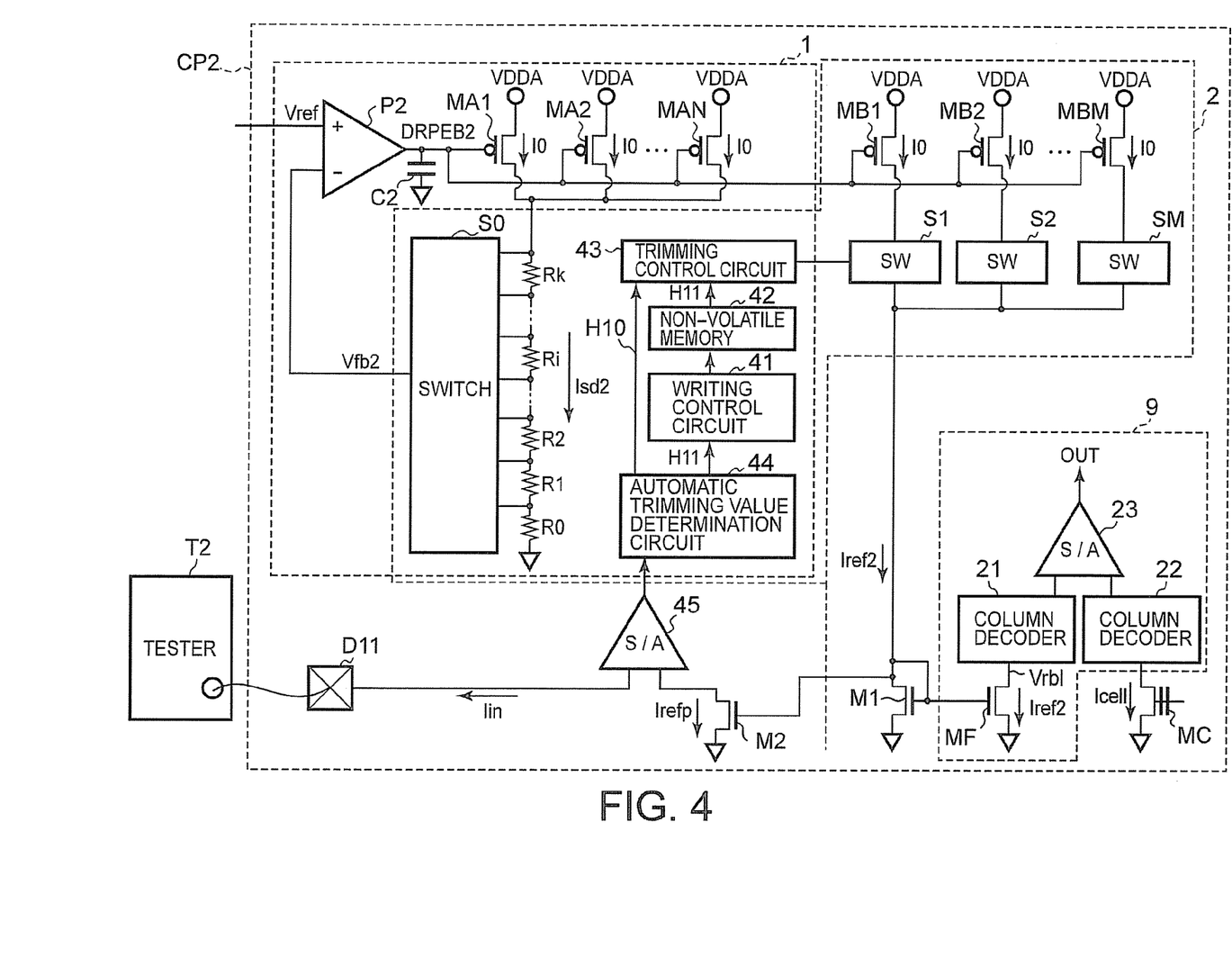
FIG. 4 is a block diagram schematically showing a structure of a reference current generating circuit according to a fourth embodiment of the invention.

FIG. 4 is a block diagram schematically showing a structure of a reference current generating circuit according to a fourth embodiment of the invention. In FIG. 4, the reference current generating circuit includes an N-channel field effect transistor M2, a writing control circuit 41, a nonvolatile memory 42, a trimming control circuit 43, an automatic trimming value determination circuit 44 and a sense amplifier 45, in addition to the configuration of the reference current generating circuit in FIG. 2.

Here, the sense amplifier 45 compares a drain current Irefp of the N-channel field effect transistor M2 with an input current-Iin. One input terminal of the sense amplifier 45 is connected to a pad electrode D11, while the other input terminal of the sense amplifier 45 is connected to the drain of the N-channel field effect transistor M2. The automatic trimming value determination circuit 44 determines a trimming value H11 used by switches S1 to SM so that the difference between the drain current Irefp and the input current-Iin becomes 0. The nonvolatile memory 42 stores the trimming value H11 indicating the number of the P-channel field effect transistors MB1 to MBM to be selected. The writing control circuit 41 controls writing to the nonvolatile memory 42. The trimming control circuit 43 adjusts the number of the P-channel field effect transistors MB1 to MBM that are selected by the switches S1 to SM on the basis of a trimming value H10 determined by the automatic trimming value determination circuit 44 or the trimming value H11 stored in the nonvolatile memory 42.

A standard current generating circuit 1, a trimming circuit 2, a sense circuit 9, the N-channel field effect transistors M1, M2, the writing control circuit 41, the nonvolatile memory 42, the trimming control circuit 43, the automatic trimming value determination circuit 44, the sense amplifier 45, and the pad electrode D11 are formed on a semiconductor chip CP2.

The trimming of the reference current Iref2 is done in the product inspection before the shipment in the following method. The pad electrode D11 is connected to the current input terminal of a tester T2, and the input current-Iin is supplied to the pad electrode D11 from the tester T2. When the input current-Iin is supplied from tester T2 to the pad electrode D11, the input current-Iin is inputted to one input terminal of the sense amplifier 45.

The trimming value H10 is outputted from the automatic trimming value determination circuit 44 to the trimming control circuit 43. When the trimming value H10 is outputted to the trimming control circuit 43, each of the switches S1 to SM is turned on or off according to the trimming value H10. The number of the P-channel field effect transistors MB1 to MBM from which the drain current I0 is taken is adjusted by the switching operation. Thus, the reference current Iref2 is generated. When the reference current Iref2 is generated, the current Irefp having the same value as the reference current Iref2 flows through the N-channel field effect transistor M2 due to current mirror operation between the N-channel field effect transistors M1, M2, and is inputted to the other terminal of the sense amplifier 45.

The current Irefp is then compared with the input current-Iin in the sense amplifier 45, and the comparison result is inputted to the automatic trimming value determination circuit 44. Updating of the trimming value H10 is then repeated in the automatic trimming value determination circuit 44 until the current Irefp becomes equal to the input current-Iin. The trimming value H11 when the current Irefp becomes equal to the input current-Iin is inputted to the writing control circuit 41, and the trimming value H11 is written in the nonvolatile memory 42.

Then, when power is supplied to the product after the product shipment, the trimming value H11 stored in the nonvolatile memory 42 is read by the trimming control circuit 43, and each of the switches S1 to SM is turned on or off according to the trimming value H11. The number of the P-channel field effect transistors MB1 to MBM from which the drain current I0 is taken is adjusted by the switching operation. Then, the drain current I0 flowing from the turned-on P-channel field effect transistors MB1 to MBM are merged. Thus, the reference current Iref2 is generated and supplied to the N-channel field effect transistor M1.

Fifth Embodiment

Figure 5:
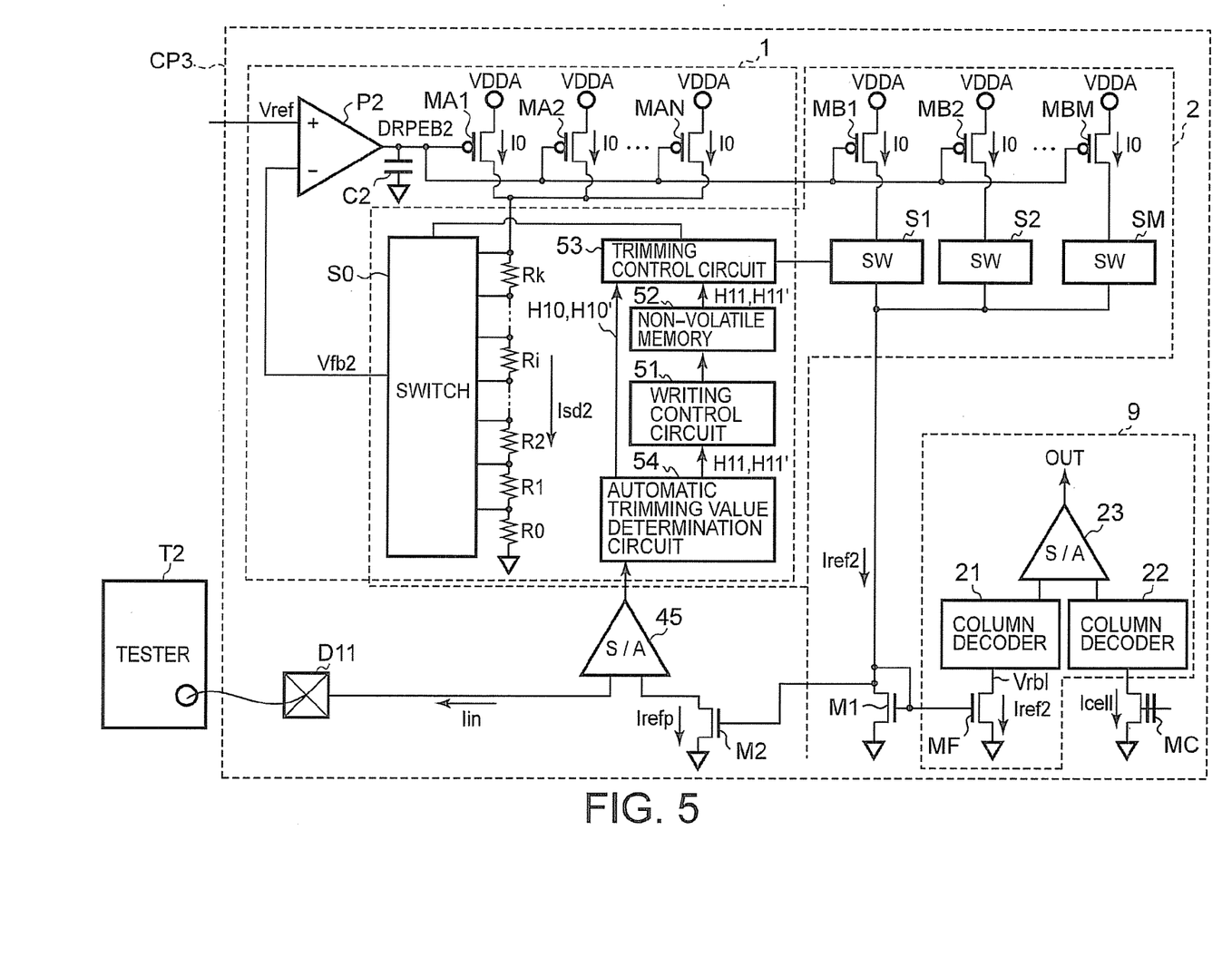
FIG. 5 is a block diagram schematically showing a structure of a reference current generating circuit according to a fifth embodiment of the invention.

FIG. 5 is a block diagram schematically showing a structure of a reference current generating circuit according to a fifth embodiment of the invention. In FIG. 5, the reference current generating circuit includes a writing control circuit 51, a nonvolatile memory 52, a trimming control circuit 53, and an automatic trimming value determination circuit 54 which replace the writing control circuit 41, the nonvolatile memory 42, the trimming control circuit 43, and the automatic trimming value determination circuit 44 in FIG. 4, respectively. The automatic trimming value determination circuit 54 determines a trimming value H11' used by a switch S0 and a trimming value H11 used by switches S1 to SM, so that the difference between a drain current Irefp and an input current-Iin becomes 0. The nonvolatile memory 52 stores the trimming values H11', H11 used by the switches S0, S1 to SM. The writing control circuit S1 controls writing to the nonvolatile memory 52. The trimming control circuit 53 adjusts the number of P-channel field effect transistors MB1 to MBM that are selected by the switches S1 to SM on the basis of a trimming value H10 determined by the automatic trimming value determination circuit 54 or the trimming value H11 stored in the nonvolatile memory 52. At the same time, the trimming control circuit 53 adjusts a switching position set by the switch S0 on the basis of a trimming value H10' determined by the automatic trimming value determination circuit 54, or the trimming value H11' stored in the nonvolatile memory 52.

A standard current generating circuit 1, a trimming circuit 2, a sense circuit 9, N-channel field effect transistors M1, M2, the writing control circuit 51, the nonvolatile memory 52, the trimming control circuit 53, the automatic trimming value determination circuit 54, a sense amplifier 45, and a pad electrode D11 are formed on a semiconductor chip CP3.

The trimming of a reference current Iref2 is done in the product inspection before the shipment in the following method. The pad electrode D11 is connected to a current input terminal of a tester T2 and the input current-Iin is supplied to the pad electrode D11 from the tester T2, then the input current-Iin is inputted to one input terminal of the sense amplifier 45.

The trimming values H10, H10' are outputted from the automatic trimming value determination circuit 54 to the trimming control circuit 53. When the trimming values H10, H10' are outputted to the trimming control circuit 53, one of the terminals of resistors R0 to Rk is selected by switching of the switch S0 in accordance to the trimming value H10'. Consequently, a standard current Isd2 is adjusted, and each of the switches S1 to SM is turned on or off according to the trimming value H10. Thus, the number of the P-channel field effect transistors MB1 to MBM from which drain current is taken is adjusted, and the reference current Iref2 is generated. When the reference current Iref2 is generated, the current Irefp having the same value as the reference current Iref2 flows through the N-channel field effect transistor M2 due to current mirror operation between the N-channel field effect transistors M1, M2, and is inputted to the other terminal of the sense amplifier 45.

The current Irefp is then compared with the input current-Iin in the sense amplifier 45, and the comparison result is inputted to the automatic trimming value determination circuit 54. Updating of the trimming values H10, H10' is then repeated in the automatic trimming value determination circuit 54 until the current Irefp becomes equal to the input current-Iin. The trimming values H11, H11' when the current Irefp becomes equal to the input current-Iin is inputted to the writing control circuit 51, and the trimming values H11, H11' are written in the nonvolatile memory 52.

Then, when power is supplied to the product after the product shipment, the trimming values H11, H11' stored in the nonvolatile memory 52 are read by the trimming control circuit 53, and one of the terminals of the resistors R0 to Rk is selected by switching of the switch S0 in accordance to the trimming value H11'. Consequently, the standard current Isd2 is adjusted, and each of the switches S1 to SM are turned on or off according to the trimming value H11. Thus, the number of the P-channel field effect transistors MB1 to MBM from which the drain current I0 is taken is adjusted. Then, the drain current I0 flowing from the turned-on field effect transistors MB1 to MBM are merged. Thus, the reference current Iref2 is generated and supplied to the N-channel field effect transistor M1.

Sixth Embodiment

Figure 6:
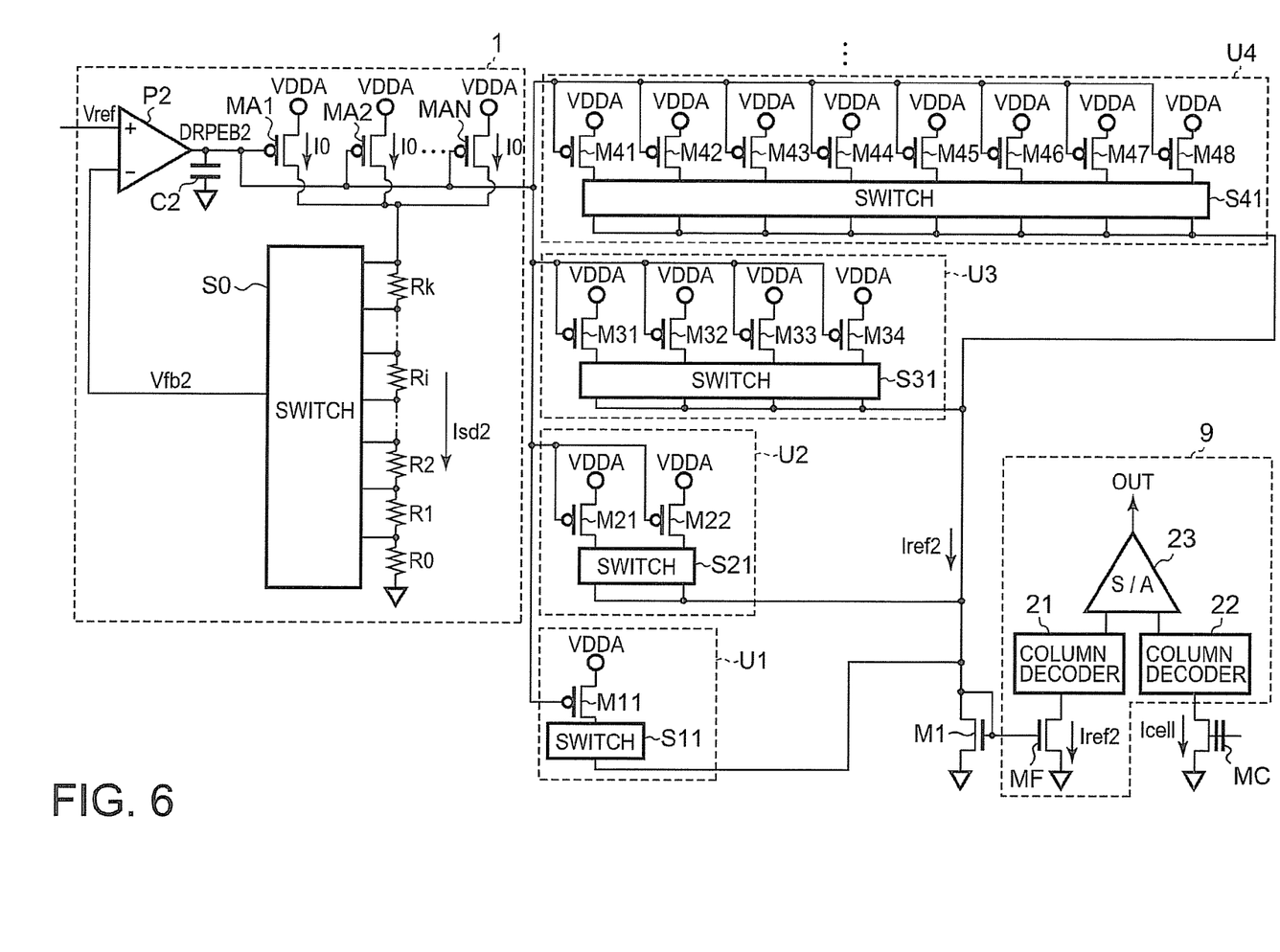
FIG. 6 is a block diagram schematically showing a structure of a reference current generating circuit according to a sixth embodiment of the invention.

FIG. 6 is a block diagram schematically showing a structure of a reference current generating circuit according to a sixth embodiment of the invention. In FIG. 6, this reference current generating circuit includes trimming units U1 to U4 instead of the P-channel field effect transistors MB1 to MBM and the switches S1 to SM in FIG. 2.

Here, the trimming unit U1 includes a P-channel field effect transistor M11 and a switch S11. The gate and the source of the P-channel field effect transistor M11 are connected to the output terminal of an operational amplifier P2 and to a power supply potential VDDA, respectively. The drain of the P-channel field effect transistor M11 is connected to the drain of an N-channel field effect transistor M1 via the switch S11.

The trimming unit U2 includes P-channel field effect transistors M21, M22, and a switch S21. The gates of the P-channel field effect transistors M21, M22 are connected to the output terminal of the operational amplifier P2, and the sources of the P-channel field effect transistors M21, M22 are connected to the power supply potential VDDA. The drains of the P-channel field effect transistors M21, M22 are connected to the drain of the N-channel field effect transistor M1 via the switch S21.

The trimming unit U3 includes P-channel field effect transistors M31 to M34 and a switch S31. The gates of the P-channel field effect transistors M31 to M34 are connected to the output terminal of the operational amplifier P2, and the sources of the P-channel field effect transistors M31 to M34 are connected to the power supply potential VDDA. The drains of the P-channel field effect transistors M31 to M34 are connected to the drain of the N-channel field effect transistor M1 via the switch S31.

The trimming unit U4 includes P-channel field effect transistors M41 to M48 and a switch S41. The gates of the P-channel field effect transistors M41 to M48 are connected to the output terminal of the operational amplifier P2, and the sources of the P-channel field effect transistors M41 to M48 are connected to the power supply potential VDDA. The drains of the P-channel field effect transistors M41 to M48 are connected to the drain of the N-channel field effect transistor M1 via the switch S41.

The trimming of a reference current Iref2 is performed in the following manner. The number of the P-channel field effect transistors M11, M21 and M22, M31 to M34, M41 to M48 which contribute to the generation of the reference current Iref2 is adjusted by using a combination of the trimming units U1 to U4. This allows to reduce the size of circuit structure and also the surface area of chip compared with the method in FIG. 2, where the P-channel field effect transistors MB1 to MBM which contribute to the generation of the reference current Iref2 are individually selected.

The embodiment of FIG. 6 describes a method in which the trimming units U1, U2, U3, U4 respectively having 1, $2^2$, $2^4$, $2^8$ of transistors are provided as a combination of transistors and switches. However, in general, there may be provided trimming units respectively having $2^0$, $2^1$, ... $2^E$ (E is a positive integer) of transistors as a combination of transistors and switches.

Figure 7:
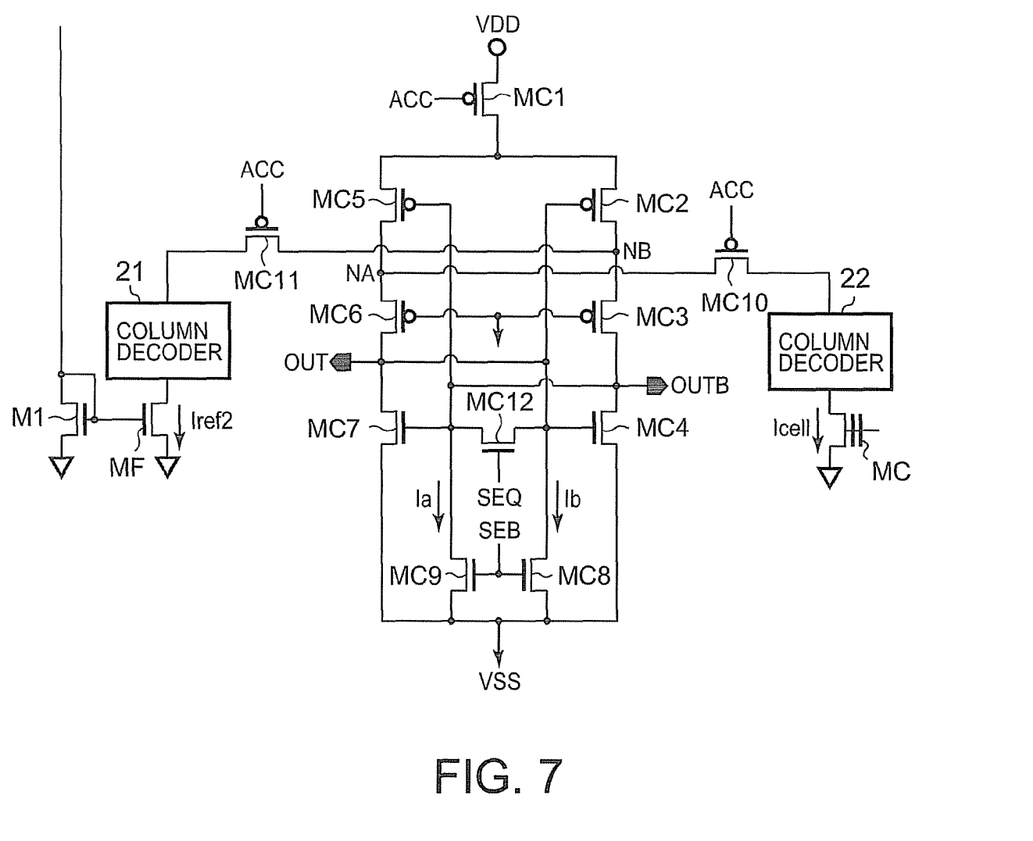
FIG. 7 is a circuit diagram schematically showing a structure of a sense amplifier used in the invention.

FIG. 7 is a circuit diagram schematically showing a structure of the sense amplifier 23 used in the invention. In FIG. 7, the sense amplifier 23 includes N-channel field effect transistors MC4, MC7 to MC9 and P-channel field effect transistors MC1 to MC3, MC5, MC6, MC10, MC11.

While the drain of the N-channel field effect transistor MC4 and the drain of the P-channel field effect transistor MC3 are connected to each other, the gate of the N-channel field effect transistor MC4 and the gate of the P-channel field effect transistor MC2 are connected to each other. While the drain of the N-channel field effect transistor MC7 and the drain of the P-channel field effect transistor MC6 are connected to each other, the gate of the N-channel field effect transistor MC7 and the gate of the P-channel field effect transistor MC5 are connected to each other.

The drain of the N-channel field effect transistor MC4 and the drain of the P-channel field effect transistor MC3 are connected to the gate of the N-channel field effect transistor MC7 and the gate of the P-channel field effect transistor MC5. The drain of the N-channel field effect transistor MC7 and the drain of the P-channel field effect transistor MC6 are connected to the gate of the N-channel field effect transistor MC4 and the gate of the P-channel field effect transistor MC2.

The P-channel field effect transistor MC6 and the P-channel field effect transistor MC5 are connected in series to form a node NA. The P-channel field effect transistor MC3 and the P-channel field effect transistor MC2 are connected in series to form a node NB. The sources of the P-channel field effect transistors MC2, MC5 are connected to a power supply potential VDD via the P-channel field effect transistor MC1. The gate of the P-channel field effect transistor MC3 and the gate of the P-channel field effect transistor MC6 are connected to each other. The node NA is connected to a column decoder 22 via P-channel field effect transistor MC10, and the node NB is connected to a column decoder 21 via the P-channel field effect transistor MC11.

The drain of the N-channel field effect transistor MC9 is connected to the gate of the N-channel field effect transistor MC7, and the drain of the N-channel field effect transistor MC8 is connected to the gate of the N-channel field effect transistor MC4. The gates of the N-channel field effect transistors MC8, MC9 are connected to each other, and the sources of the N-channel field effect transistors MC4, MC7, MC8, MC9 are connected to the power supply potential VSS. An N-channel field effect transistor MC12 is inserted between the gate of the N-channel field effect transistor MC4 and the gate of the N-channel field effect transistor MC7.

The reference current Iref2 is inputted to the connection point between the drain of the P-channel field effect transistor MC2 and the source of the P-channel field effect transistor MC3. A cell current Icell is inputted to the connection point between the drain of the P-channel field effect transistor MC5 and the source of the P-channel field effect transistor MC6. An ACC signal is inputted to the gates of the P-channel field effect transistors MC1, MC10, MC11, and the P-channel field effect transistor MC1 forms a current source.

An output signal OUT is outputted from the connection point between the drain of the P-channel field effect transistor MC6 and the drain of the N-channel field effect transistor MC7. An output signal OUTB is outputted from the connection point between the drain of the P-channel field effect transistor MC3 and the drain of the N-channel field effect transistor MC4.

A sense amplifier enable signal SEB is supplied to the gates of the N-channel field effect transistors MC8, MC9. When the sense amplifier enable signal SEB changes from high to low, the sense amplifier 23 in FIG. 4 performs sensing operation. The sense amplifier 23 in FIG. 4 performs current sensing while the voltage level of the sense amplifier enable signal SEB is high, and performs voltage sensing while the voltage level of the sense amplifier enable signal SEB is low.

A low level potential is inputted to the gates of the P-channel field effect transistors MC3, MC6, and thereby the P-channel field effect transistors MC3, MC6 are always turned on. Before a sensing operation is started, an equalizing signal SEQ is set to high, and is kept to be high until the voltage level of the output signal OUT becomes equal to that of the output signal OUTB. Then the equalizing signal SEQ is set to low.

Before the sensing operation is started, the sense amplifier enable signal SEB is high. Therefore, the N-channel field effect transistors MC8, MC9 are ON, and currents Ib, Ia which flow through the N-channel field effect transistors MC8, MC9, respectively, is equal to each other. At this point, the output signal OUT, OUTB are both low, the N-channel field effect transistors MC4, MC7 are both turned off, and the P-channel field effect transistors MC2, MC5 are both turned on. Accordingly, a portion of the current from the P-channel field effect transistor MC1 flows to memory cell MC direction, and the remaining portion flows to a ground terminal through the P-channel field effect transistor MC6 and the N-channel field effect transistor MC8. Similarly, a portion of the current from the P-channel field effect transistor MC1 flows to N-channel field effect transistor MF direction, and the remaining portion flows to the ground terminal through the P-channel field effect transistor MC3 and the N-channel field effect transistor MC9.

Subsequently, when the voltage level of the sense amplifier enable signal SEB is gradually lowered, the N-channel field effect transistor MC8, MC9 operates toward an OFF state, and the drain-source resistances of the N-channel field effect transistors MC8, MC9 increase. Accordingly, the current does not flow easily between the chains and sources of the N-channel field effect transistor MC8, MC9. As a result, the difference between a current Ib flowing through the N-channel field effect transistor MC8 and a current Ia flowing through the N-channel field effect transistor MC9 (Ib-Ia) becomes greater than the difference between the cell current Icell and the reference current Iraf2 (Icell-Iref2). This operation is called a current sensing. In the case of Icell>Iref2, for example, Ib-Ia gradually increases due to the current sensing.

When the voltage level of the sense amplifier enable signal SEB is further lowered, the current Ib becomes substantially greater than the current Ia, and accordingly the drain-source resistances of the N-channel field effect transistors MC8, MC9 also increase. Thus, the gate voltage level of the N-channel field effect transistor MC4, i.e., the voltage level of the output signal OUT increases, and the N-channel field effect transistor MC4 operates toward an ON state. Accordingly, the voltage level of the output signal OUTB decreases, and the difference between the voltage levels of the output signals OUT, OUTB gradually increases. This operation is called a voltage sensing. In the case of Icell>Iref2, the output signal OUT is high and the output signal OUTB is low, since the voltage level difference between the signals OUT and OUTB is amplified. Thus, the resultant logic is determined.

Seventh Embodiment

Figure 8:
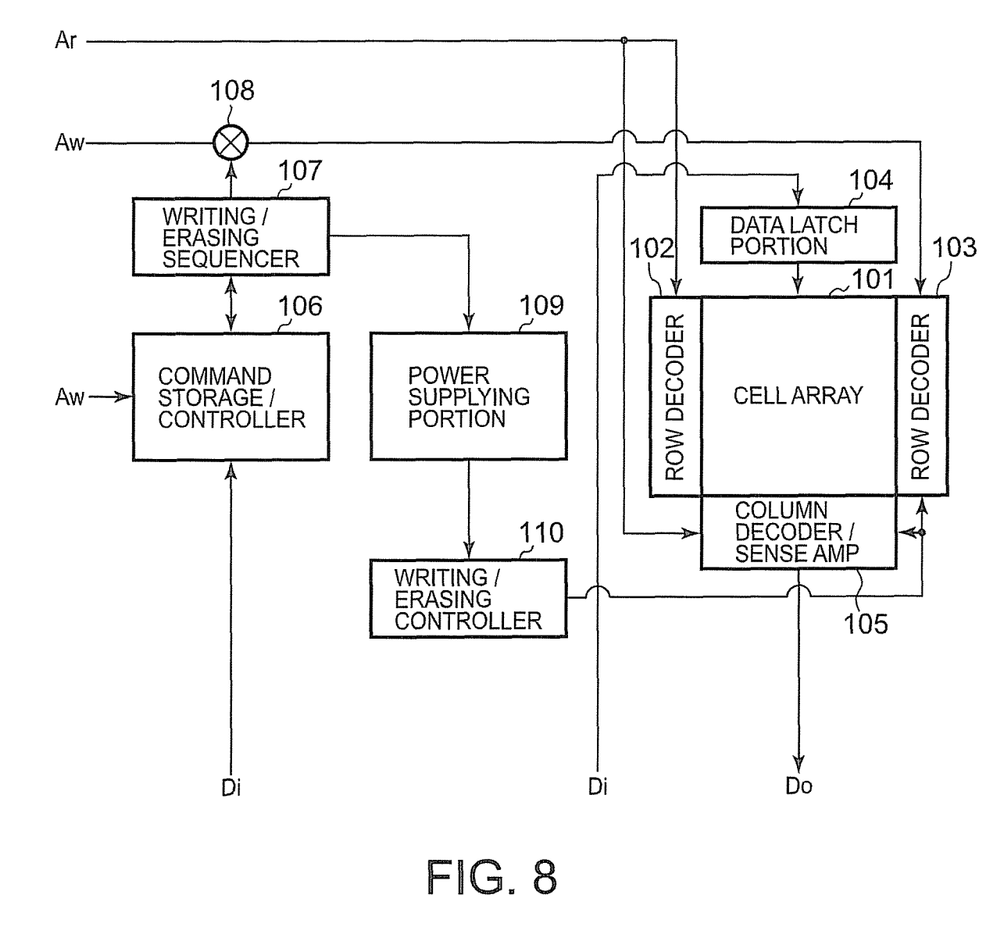
FIG. 8 is a block diagram schematically showing a structure of a semiconductor memory device according to the seventh embodiment of the invention, to which the reference current generating circuit is applied.

FIG. 8 is a block diagram schematically showing a structure of a semiconductor memory device to which the reference current generating circuit according to a seventh embodiment of the invention is applied. In FIG. 8, the semiconductor memory device includes a memory cell array 101 in which the memory cells MC of FIG. 1 or 2 are arranged in a matrix form, a row decoder 102 which selects the memory cells MC in a row direction at the time of read-out, a row decoder 103 which selects the memory cells MC in a row direction at the time of writing/erasing, a data latch portion 104 which latches input data Di at the time of writing, a column decoder/sense amplifier 105 which selects the memory cells MC in a column direction, and amplifies read data. The semiconductor memory device further includes a command storage/controller 106 which generates a command sequence at the time of macro controlling, a writing/erasing sequencer 107 which controls writing/erasing of an address, a selector 108 which selects between an externally specified writing/erasing address Aw and a writing/erasing address generated by the writing/erasing sequencer 107, a power supplying portion 109 which supplies a power required to perform writing/erasing, and a writing/erasing controller 110 which controls writing/erasing.

When the reference current generating circuit in FIG. 1 is applied to the semiconductor memory device in FIG. 8, the reference voltage Vref is generated in the power supplying portion 109. The operational amplifier P1, the P-channel field effect transistor MA, the capacitor C1, the resistors R0 to R7, and the switch S are provided in the writing/erasing controller 110, and the sense circuit 9 is provided in the column decoder/sense amplifier 105.

When the reference current generating circuit in FIG. 2 is applied to the semiconductor memory device in FIG. 8, the reference voltage Vref is generated in the power supplying portion 109. The standard current generating circuit 1 and the trimming circuit 2 can be provided in the writing/erasing controller 110, and the sense circuit 9 and the N-channel field effect transistor M1 can be provided in the column decoder/sense amplifier 105.

When the externally specified writing/erasing address Aw is used at the time of writing/erasing, the writing/erasing address Aw is inputted to the row decoder 103 via the selector 108, and the memory cells MC in a row direction are selected. Also, the input data Di is inputted to the data latch portion 104 and the writing/erasing controller 110 so as to be latched, while the memory cells MC in a column direction are selected and writing/erasing of selected cells are performed.

On the other hand, when internally specified writing/erasing addresses are used at the time of writing/erasing, a command sequence is generated in the command storage/controller 106. The writing/erasing addresses are incremented or decremented at the writing/erasing sequencer 107, and at the same time the writing/erasing addresses are inputted to the row decoder 103 via the selector 108. Thus, the memory cells MC in a row direction are selected. Also, the input data Di is inputted to the data latch portion 104 so as to be latched, and the memory cells MC in a column direction are selected and writing/erasing of selected cells are performed.

At the time of read-out, a reading address Ar is inputted to the row decoder 102 and the column decoder/sense amplifier 105. While the memory cells MC in a row direction are selected by the row decoder 102, the memory cells MC in a column direction are selected by the column decoder/sense amplifier 105. Then, a cell current read from the memory cell MC is compared with a reference current at the column decoder/sense amplifier 105. When the cell current is greater than the reference current, read data is determined to be "1", and when the cell current is smaller than the reference current, the read data is determined to be "0."

Eighth Embodiment

Figure 9:
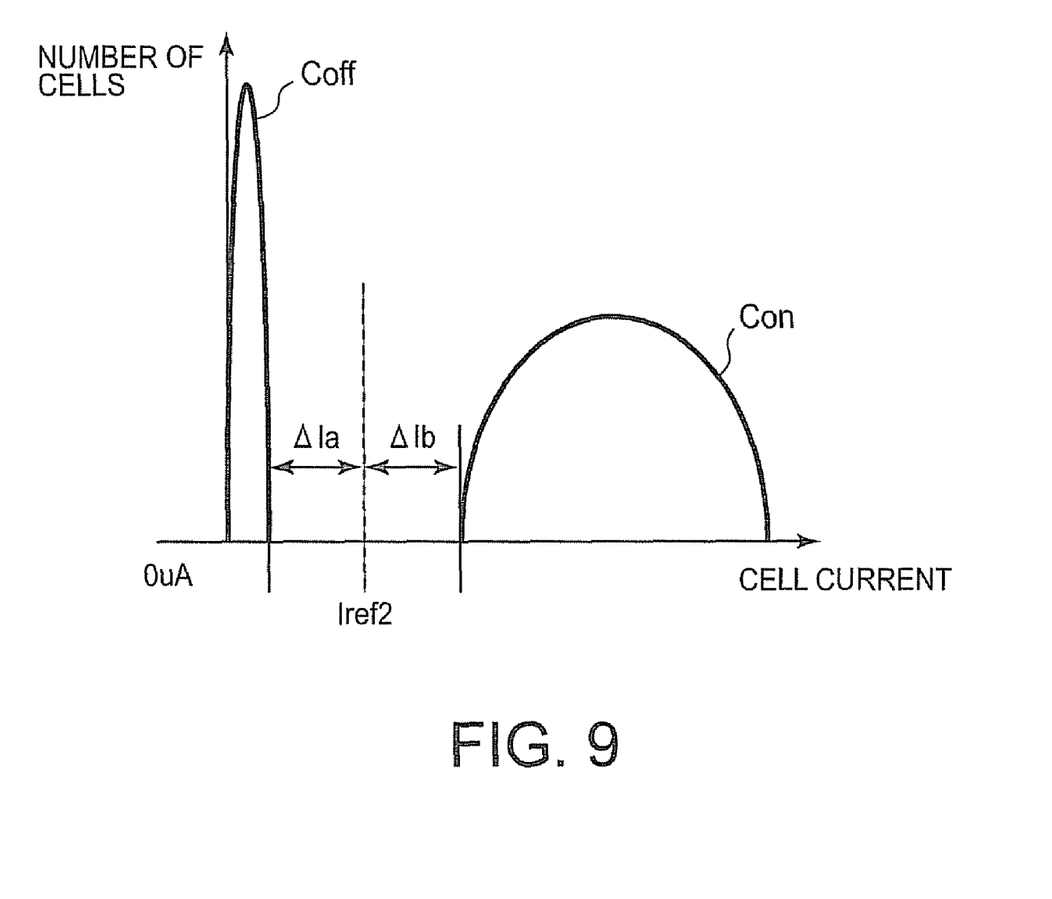
FIG. 9 is a diagram showing a method to set a reference current according to the eighth embodiment of the invention.

FIG. 9 is a diagram showing a setting method for a reference current according to an eighth embodiment of the invention. In FIG. 9, since the cell current is varied due to manufacturing process variation, operating temperature, a power supply voltage, or the like, the range of variation in on-cell (cell to be erased) current (Con) is several times greater than the range of variation in off-cell (cell to be written) current (Coff) even if a word line voltage of on-cell is the same as one of off-cell.

In order to distinguish on-cells from off-cells, the reference current Iref2 in FIG. 2 needs to be set in an intermediate area which is not included in the range of on-cell current variation Con and the range of off-cell current variation Coff. Here, assume that the difference between the upper limit of the off-cell current distribution and the reference current Iref2 in FIG. 2 is $\Delta$Ia, and the difference between the lower limit of the on-cell current distribution and the reference current Iref2 in FIG. 2 is $\Delta$Ib. Ideally, it is preferable to set the value of reference current Iref2 so that $\Delta$Ia=$\Delta$Ib.

By selecting one of the terminals of the resistors R0 to Rk by the switch S0 in FIG. 2, and by selecting the number of the P-channel field effect transistors MB1 to MBM to be turned on by the switches S1 to SM, it is possible to set the value of the reference current Iref2 so that $\Delta$Ia=$\Delta$Ib, even if the range of on-cell current variation Con varies.

The present invention is not limited directly to the above described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined. It is to therefore be understood that within the scope of the appended claims, the present invention may be practiced other than as specifically disclosed herein.

What is claimed is:

1. A reference current generating circuit, comprising:
    an operational amplifier having one input terminal to receive a reference voltage;
    N first field effect transistors (N is integer) each having a gate to commonly receive an output voltage of the operational amplifier and a drain;
    a series circuit including a plurality of resistors connected in series and having one terminal connected to each of drains of the first field effect transistors and feed backing a voltage at one of connection points of the resistors to the other input terminal of the operational amplifier;
    M second field effect transistors (M is an integer not less than 2) each having a gate to commonly receive an output voltage of the operational amplifier; and
    a plurality of first switches to select the second field effect transistors to generate a reference current by merging current through each of the selected second field effect transistors;
    a third field effect transistor having a gate to receive the reference current;
    a sense amplifier to compare a drain current of the third field effect transistor with an input current;
    an automatic trimming value decision circuit to decide a trimming value so as to set a difference between the drain current and the input current to be zero;
    a non-volatile memory to store the trimming value determined by the automatic trimming value decision circuit;
    a writing control circuit to control the writing in the non-volatile memory; and
    a trimming control circuit to adjust a number of the second field effect transistors to be selected by the first switches based on either one of the trimming values decided by the automatic trimming value decision circuit or stored in the non-volatile memory.

2. The reference current generating circuit according to claim 1, wherein the reference current generating circuit includes a second switch to selectively connect one connection point of the plurality of resistors to the other terminal of the operational amplifier.

3. The reference current generating circuit according to claim 1, wherein the size and shape of the first field effect transistors are the same as those of the second field effect transistors.

4. The reference current generating circuit according to claim 3, wherein the respective second field effect transistors output same amount of drain current.

5. The reference current generating circuit according to claim 1, wherein the trimming value is written in the non-volatile memory before shipment in advance and the first switches are controlled by the trimming value read out from the non-volatile memory when power is on.

6. The reference current generating circuit according to claim 1, wherein a band gap reference voltage is used as the reference voltage.

7. The reference current generating circuit according to claim 1, further including a capacitor connected to the gate of the first field effect transistor.

8. The reference current generating circuit according to claim 1, wherein the first switches are set so that the reference current value is within an intermediate area between a lower limit of the on-cell current distribution and an upper limit of the off-cell current distribution.

9. The reference current generating circuit according to claim 1, wherein the plurality of second field effect transistors and the first switches are grouped into a plurality of units and the respective first switches commonly control the switching operation of the second field effect transistors in the respective units.

* * * * *